(12) United States Patent
Chen et al.

(10) Patent No.: US 8,610,221 B2
(45) Date of Patent: Dec. 17, 2013

(54) LOW MISMATCH SEMICONDUCTOR DEVICE AND METHOD FOR FABRICATING SAME

(75) Inventors: Xiangdong Chen, Irvine, CA (US); Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 498 days.

(21) Appl. No.: 12/657,909

(22) Filed: Jan. 29, 2010

(65) Prior Publication Data

US 2011/0186934 A1 Aug. 4, 2011

(51) Int. Cl.
*H01L 27/088* (2006.01)

(52) U.S. Cl.
USPC ............................ 257/394; 257/327; 438/174

(58) Field of Classification Search
USPC .................. 257/13, 69, 392, 411, 394, 327; 438/230, 231, 275, 287, 301, 585, 592, 438/174
See application file for complete search history.

(56) References Cited

U.S. PATENT DOCUMENTS 7,229,873 B2 * 6/2007 Colombo et al. ............. 438/231
2008/0237604 A1 * 10/2008 Alshareef et al. .............. 257/69

* cited by examiner

*Primary Examiner* — Kimberly Rizkallah
*Assistant Examiner* — Errol Fernandes
(74) *Attorney, Agent, or Firm* — Farjami & Farjami LLP

(57) ABSTRACT

Disclosed is a low mismatch semiconductor device that comprises a lightly doped channel region having a first conductivity type and a first dopant concentration in a semiconductor body, and a high-k metal gate stack including a gate metal layer formed over a high-k gate dielectric without having a dielectric cap on the high-k dielectric. The high-k metal gate stack being formed over the lightly doped channel region. The lightly doped channel region may be a P- or N-conductivity region, for example, and may be part of a corresponding P- or N-semiconductor substrate, or a P- or N-well formed in a substrate of the respectively opposite conductivity type. The disclosed semiconductor device, which may be an NMOS or PMOS analog device, for example, can be fabricated as part of an integrated circuit including one or more CMOS logic devices.

20 Claims, 6 Drawing Sheets

LOW MISMATCH SEMICONDUCTOR DEVICE AND METHOD FOR FABRICATING SAME

BACKGROUND OF THE INVENTION

1. Field of the Invention

The present invention is generally in the field of semiconductors. More specifically, the present invention is in the field of fabrication of semiconductor devices.

2. Background Art

Due to its numerous advantages, such as high density, low power consumption, and relative noise immunity, for example, complementary metal-oxide-semiconductor (CMOS) technology is widely used in control logic circuits, and in analog circuits implemented as part of the integrated circuits (ICs) used in modern electronic systems. As advancements in process technologies have resulted in CMOS devices being scaled down, and their operating voltages correspondingly reduced, device features have evolved to include, for example, high dielectric constant (high-k) metal gate designs.

Mismatch is particularly critical to analog device performance. A conventional fabrication strategy responsive to the problem of mismatch employs the use of relatively long channel lengths, e.g., channel lengths of 0.5 µm or greater, to lower its incidence in analog metal-oxide-semiconductor field-effect transistors (MOSFETs). However, the use of long channels as a solution to analog device mismatch is incompatible with the progressive advancement of process technologies towards ever reduced device dimensions.

Thus, there is a need to overcome the drawbacks and deficiencies in the art by delivering a solution compatible with existing high-k metal gate CMOS fabrication process flows, which enables concurrent fabrication of low mismatch analog devices.

SUMMARY OF THE INVENTION

A low mismatch semiconductor device and method for fabricating same, substantially as shown in and/or described in connection with at least one of the figures, as set forth more completely in the claims.

DETAILED DESCRIPTION OF THE INVENTION

Figure 1:
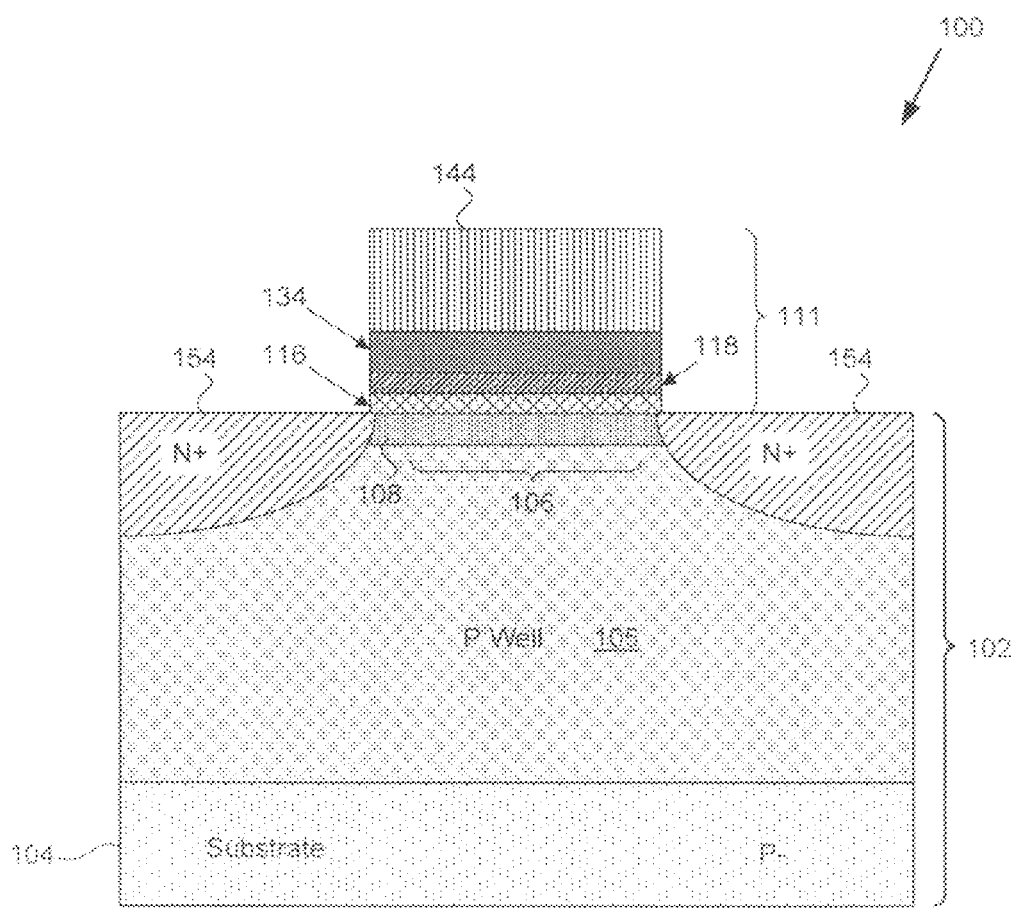
FIG. 1 shows a cross-sectional view of a structure representing a conventional metal-oxide-semiconductor field-effect transistor (MOSFET).

The present invention is directed to a low mismatch semiconductor device and method for its fabrication. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows a cross-sectional view of a structure representing a conventional metal-oxide-semiconductor field-effect transistor (MOSFET) including a high-k gate dielectric and a metal gate. As shown in FIG. 1, conventional MOSFET 100 is fabricated in semiconductor body 102 including substrate 104 and well region 105. In addition to well region 105, conventional MOSFET 100 comprises channel region 106 including channel implant 108, gate stack 111 assembled over channel region 106, and source/drain regions 154. As further shown in FIG. 1, gate stack 111 includes high-k gate dielectric 116, dielectric cap 118 included to adjust the work function of gate stack 111, gate metal 134, and polysilicon 144. Conventional MOSFET 100 may be implemented as an analog NMOS device, for example.

The present inventors have realized that conventional MOSFET 100 may be susceptible to mismatch due to variations in the dopant concentration of channel implant 108 from device to device. However, it is recognized that some operational parameters of conventional MOSFET 100, such as threshold voltage, for example, can depend in part on the concentration of dopants present in channel implant 108. The present application discloses a low mismatch semiconductor device, suitable for high performance analog implementations, and a method for its fabrication that avoids the device mismatch arising from variations in the channel doping. Moreover, the present inventive concepts include a solution that reduces or eliminates undesirable device mismatch while advantageously preserving substantially unaltered, other performance features, such as threshold voltage.

Figure 2:
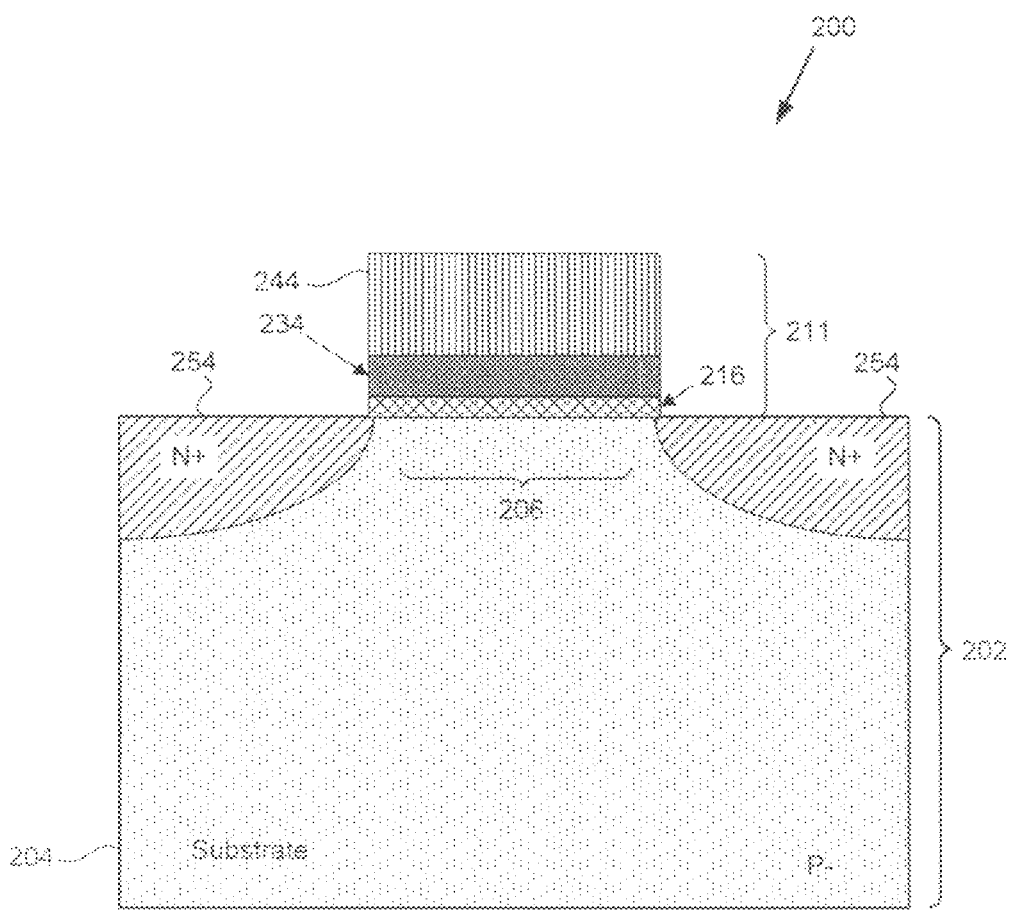
FIG. 2 shows a cross-sectional view of a structure representing a low mismatch MOSFET, according to one embodiment of the present invention.

FIG. 2 shows a cross-sectional view of a structure representing a low mismatch MOSFET, according to one embodiment of the present invention, configured to overcome the drawbacks and deficiencies associated with the conventional MOSFET 100, shown in FIG. 1. Low mismatch MOSFET 200, in FIG. 2, may be configured for use as a high performance analog device, for example, due to a reduced incidence of device mismatch resulting from its novel structure and method of fabrication. In addition, because fabrication of low mismatch MOSFET 200 can be performed using processing steps presently included in many complementary metal-oxide-semiconductor (CMOS) foundry process flows, such as a high-k metal gate logic CMOS process flow, for example, low mismatch MOSFET 200 may be fabricated alongside conventional CMOS logic devices, and may be monolithically integrated with CMOS logic, for example, in an integrated circuit (IC) fabricated on a semiconductor wafer or die.

It is noted that the specific features represented in FIG. 2 are provided as part of an example implementation of the present inventive principles, and are shown with such specificity as an aid to conceptual clarity. Because of the emphasis on conceptual clarity, it should be understood that the structures and features depicted in FIG. 2 may not be drawn to scale. Furthermore, it is noted that particular details such as the type of semiconductor device represented by low mismatch MOSFET 200, its overall layout, its channel conductivity type, and the particular dimensions attributed to its features are merely being provided as examples, and should not be interpreted as limitations. For example, although the embodiment shown in FIG. 2 characterizes low mismatch MOSFET 200 as an n-channel device, more generally, a low mismatch semiconductor device according to the present inventive principles can comprise an n-channel or p-channel MOSFET.

As shown in FIG. 2, according to one embodiment of the present invention, a low mismatch semiconductor device may correspond to low mismatch MOSFET 200. Low mismatch MOSFET 200, which is represented as an NMOS device, can be fabricated in lightly doped P type semiconductor body 202, which may comprise a portion of a silicon wafer or die, for example. Semiconductor body 202 includes lightly doped P type substrate 204, which in the present embodiment provides P-channel region 206 of low mismatch MOSFET 200. Low mismatch MOSFET 200 comprises gate stack 211 assembled over channel region 206, and source/drain regions 254. As further shown in FIG. 2, gate stack 211 of low mismatch MOSFET 200 includes high-k gate dielectric 216, gate metal 234, and polysilicon 244.

Upon comparison of the structures of low mismatch MOSFET 200, in FIG. 2, and conventional MOSFET 100, in FIG. 1, certain distinctions may be readily evident. For example, although semiconductor body 202 in FIG. 2 includes substrate 204 and source/drain regions 254, which can be seen to correspond respectively to substrate 104 and source drain regions 154, in FIG. 1, semiconductor body 202 can be seen to differ from semiconductor body 102 of conventional MOSFET 100 in certain respects. In addition, gate stack 211, and channel region 206 of low mismatch MOSFET 200 can be seen to differ from their conventional analogues in FIG. 1.

For example, by contrast to the conventional implementation shown in FIG. 1, semiconductor body 202, in FIG. 2, does not require formation of a well region, such as well region 105 of semiconductor body 102. Moreover, with respect to channel region 206, one notable difference from the conventional implementation shown in FIG. 1 is the absence, in FIG. 2, of a channel implant corresponding to channel implant 108, in FIG. 1. Regarding gate stack 211, although high-k dielectric 216, gate metal, 234, and polysilicon 244 can be seen to correspond respectively to high-k dielectric 116, gate metal 134, and polysilicon 144, in FIG. 1, it is apparent that gate stack 211, in FIG. 2, does not include a dielectric cap corresponding to dielectric cap 118, in gate stack 111 of FIG. 1.

Merely to provide specificity to the example embodiment shown in FIG. 2, sample dimensional ranges will now be described for some of the features of low mismatch MOSFET 200. For example, channel region 206 may vary in length from approximately 0.1 μm to less than approximately 0.5 μm. In addition, high-k gate dielectric 216 of gate stack 211 may be formed to a thickness of from approximately 15 Å to approximately 30 Å, while gate metal 234 may have a thickness in a range from approximately 50 Å to approximately 100 Å. Moreover, polysilicon 244 may be formed to a thickness of from approximately 300 Å to 1000 Å, for example.

The present inventors have identified variability in the doping concentration of channel implant 108 formed in conventional MOSFET 100, among ostensibly identical conventional MOSFETs, as a source of device mismatch in the conventional art. However, the concentration of dopants present in well region 105 and channel implant 108 of conventional MOSFET 100 play a role in determining the threshold voltage ($V_T$) of conventional MOSFET 100. One objective of the present application is disclosure of a low mismatch semiconductor device that is otherwise substantially indistinguishable, from an operational standpoint, from its conventional counterparts. As such, the present inventors have developed a strategy which includes elimination of well region 105 and channel implant 108 to avoid a primary source of device mismatch in the conventional art, and modification of the device gate stack so as to offset the effects on $V_T$ of omitting well region 105 and channel implant 108.

As is known in the art, the $V_T$ of a semiconductor device is determined by several factors including the respective work functions of the gate stack and the semiconductor substrate, and the dopant concentration in the channel. The inventors propose to reduce the dopant concentration in the channel by omitting well region 105 and channel implant 108, while preserving the value of $V_T$ substantially unchanged. Moreover, the inventors have conceived a fabrication process which is fully compatible with existing CMOS process flows. In one embodiment, the present invention achieves the above objectives by altering the work function of the device gate stack, through elimination of dielectric cap 118 in conventional gate stack 111 of conventional MOSFET 100, which may be used for logic CMOS, so as to offset the effect on $V_T$ of reducing the channel dopant concentration through omission of well region 105 and channel implant 108.

As a result of the present novel and inventive approach, the gate stack work function of an analog MOSFET may be approximately 200 mV to 300 mV larger for an NMOS device, such as low mismatch MOSFET 200, in FIG. 2, than that of a conventionally fabricated n-channel logic CMOS including a dielectric cap formed over its high-k gate dielectric, such as conventional MOSFET 100 including dielectric cap 118, in FIG. 1. The present inventive approach can also be suitably modified for fabrication of a low mismatch PMOS device, in which case the work function of the low mismatch PMOS may be approximately 200 mV to 300 mV smaller than that of a conventionally fabricated p-channel logic CMOS including a dielectric cap formed over its high-k gate dielectric.

Figure 3:
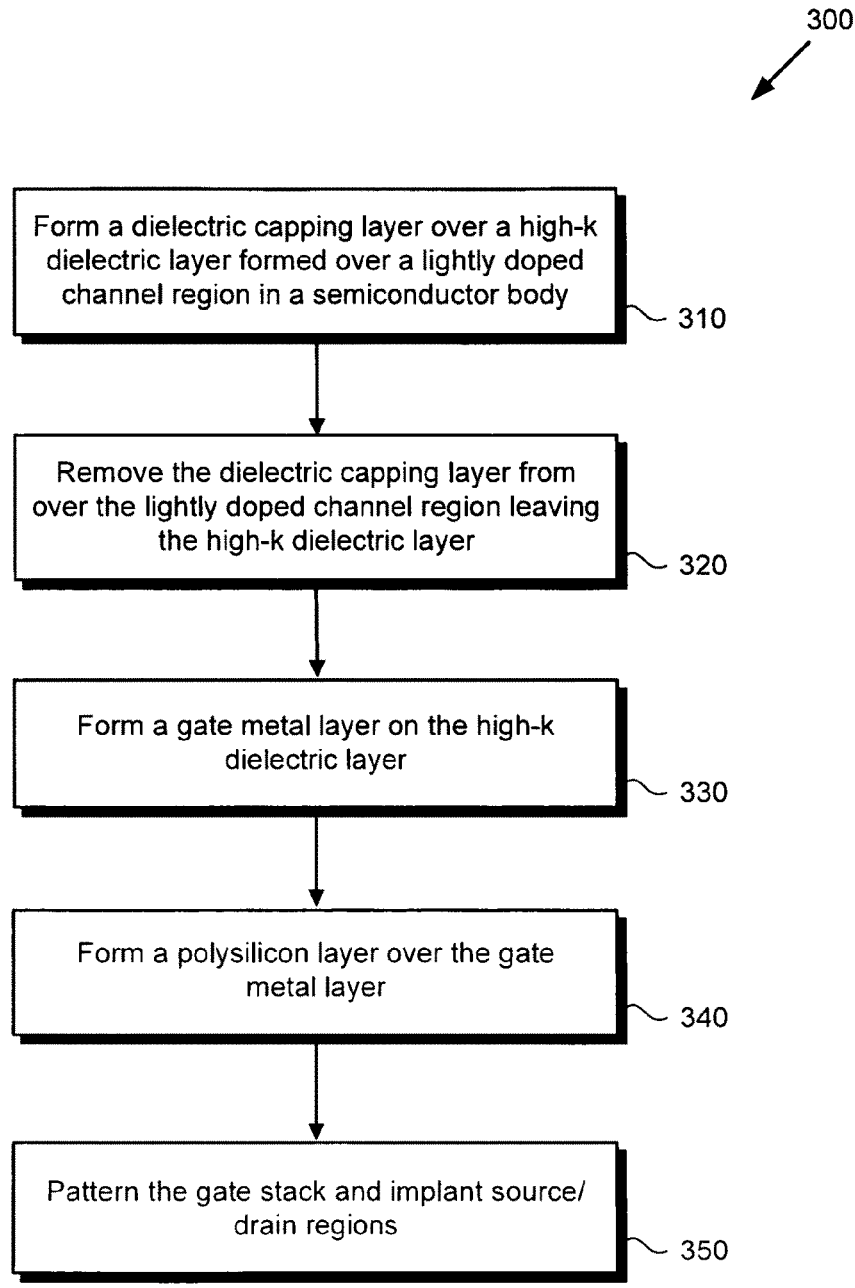
FIG. 3 is a flowchart presenting a method for fabricating a low mismatch semiconductor device, according to one embodiment of the present invention.

Additional features and advantages of a low mismatch semiconductor device, such as low mismatch MOSFET 200, in FIG. 2, will be further described in combination with FIGS. 3 and 4A through 4E. FIG. 3 shows flowchart 300 presenting a method for fabricating a low mismatch semiconductor device, according to one embodiment of the present invention. Certain details and features have been left out of flowchart 300 that are apparent to a person of ordinary skill in the art. For example, a step may comprise one or more substeps or may involve specialized equipment or materials, as known in the art. While steps 310 through 350 indicated in flowchart 300 are sufficient to describe one embodiment of the present invention, other embodiments of the present invention may utilize steps different from those shown in flowchart 300, or may comprise more, or fewer, steps.

It is noted that the processing steps shown in flowchart 300 are performed on a portion of a processed wafer, such as semiconductor body 202 in FIG. 2, which, prior to step 310, may include, among other things, a substrate, such as lightly doped P type substrate 204 in FIG. 2. Structures 410 through 450, shown respectively in FIGS. 4A through 4E, illustrate the result of performing respective steps 310 through 350 of flowchart 300. For example, structure 410 shows a semiconductor structure after processing step 310, structure 420 shows structure 410 after the processing of step 320, structure 430 shows structure 420 after the processing of step 330, and so forth.

Figure 4A:
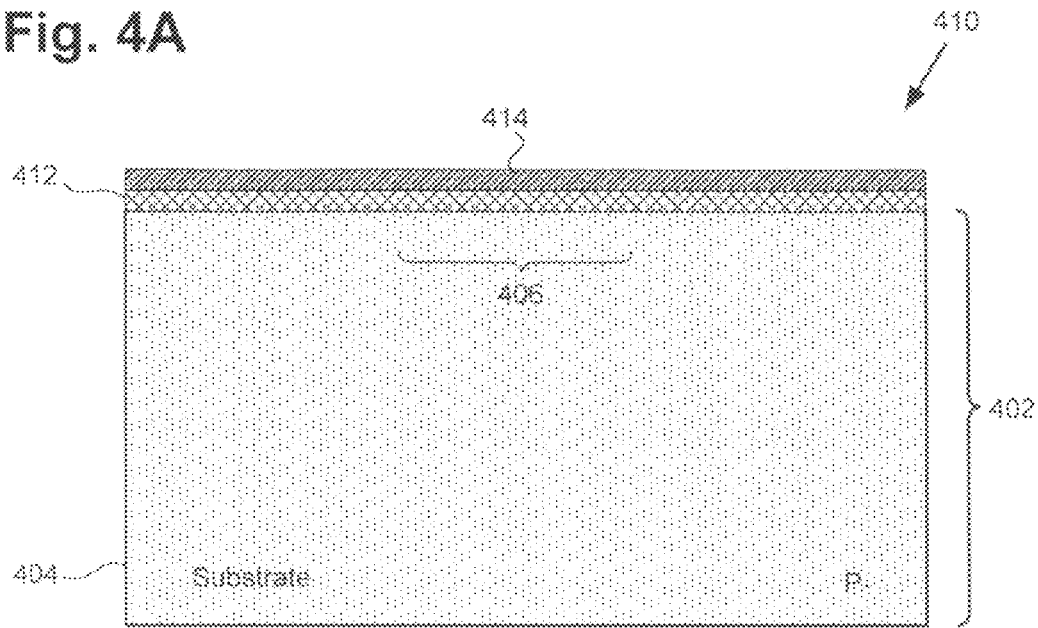
FIG. 4A shows a cross-sectional view, which includes a portion of a wafer fabricated according to an embodiment of the present invention, corresponding to an initial step in the flowchart in FIG. 3.

Referring now to FIG. 4A, structure 410 of FIG. 4A shows a structure including semiconductor body 402, after completion of step 310 of flowchart 300 in FIG. 3. In structure 410, semiconductor body 402 includes substrate 404, which can be a lightly doped P-silicon substrate. According to the embodiment of FIGS. 4A through 4E, substrate 404 also forms channel region 406 such that the dopant concentration of channel region 406 is substantially identical to the intrinsic dopant concentration of substrate 404. Semiconductor body 402 including substrate 404 corresponds to semiconductor body 202 including substrate 204, in FIG. 2. Furthermore, it is noted that although FIG. 4A shows an initial step of flowchart 300, in FIG. 3, as applied during fabrication of an NMOS device, in other embodiments, the method of flowchart 300 can be suitably modified for fabrication of a PMOS device. In those embodiments, for example, semiconductor body 402 could include a lightly doped N-substrate 404 in which channel region 406 could be formed, or a lightly doped N-well formed in P type substrate 404, for example, from which channel region 406 could be formed.

Continuing to refer to step 310 in FIG. 3 and structure 410 in FIG. 4A, at step 310 of flowchart 300, dielectric capping layer 414 is formed over high-k dielectric layer 412. As shown in FIG. 4A, high-k dielectric layer 412 is situated over lightly doped P-substrate 404 including channel region 406. High-k dielectric layer 412 can be, for example, a high-k gate dielectric layer (e.g. a high-k dielectric layer that can be utilized for forming an NMOS or PMOS gate dielectric), such as high-k gate dielectric 216 in FIG. 2. High-k dielectric layer 412 can comprise, for example, a metal oxide such as hafnium oxide ($HfO_2$), zirconium oxide ($ZrO_2$), or the like. High-k dielectric layer 412 can be formed, for example, by depositing a high-k dielectric material, such as hafnium oxide or zirconium oxide, over semiconductor body 402 by utilizing a physical vapor deposition (PVD) process, a chemical vapor deposition (CVD) process, or other suitable deposition process.

Also shown in FIG. 4A, dielectric capping layer 414 can comprise a capping material used in a typical CMOS process flow, such as a dielectric cap utilized in an NMOS or PMOS device gate stack, for example. In embodiments of the present invention in which a low mismatch semiconductor device is fabricated concurrently with other NMOS devices, for example, dielectric capping layer 414 can comprise lanthanum oxide ($La_2O_3$), magnesium oxide (MgO), barium oxide (BaO), yttrium oxide ($Y_2O_3$), or other material suitable for utilization as an NMOS device high-k dielectric cap. Alternatively, in embodiments of the present invention in which a low mismatch semiconductor device is fabricated concurrently with other PMOS devices, dielectric capping layer 414 can comprise aluminum oxide ($Al_2O_3$) or Aluminum Nitride (AlN), for example. The result of step 310 of flowchart 300 is illustrated by structure 410 in FIG. 4A.

Figure 4B:
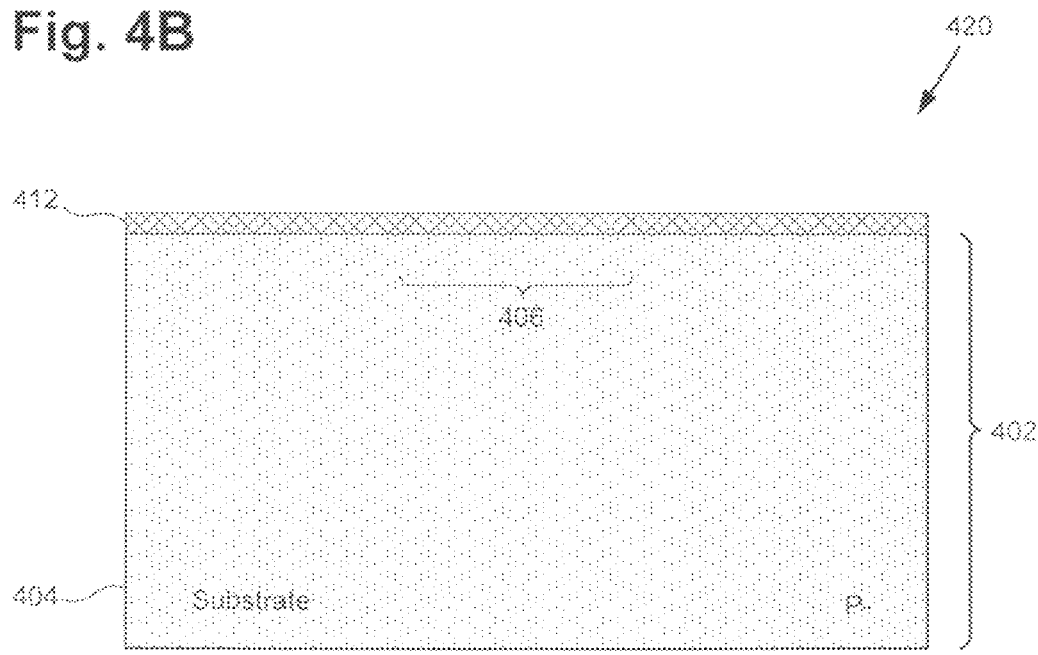
FIG. 4B shows a cross-sectional view, which includes a portion of a wafer fabricated according to an embodiment of the present invention, corresponding to an intermediate step in the flowchart in FIG. 3.

Moving on to step 320 in FIG. 3 and structure 420 in FIG. 4B, at step 320 of flowchart 300, dielectric capping layer 414 is removed from over lightly doped channel region 406, leaving high-k dielectric layer 412 over lightly doped channel region 406. During the dielectric capping layer removal process, which can include a masking step and an etch step, dielectric capping layer 414 can be removed from over lightly doped channel region 406 while being retained over other portions of semiconductor body 402 in which other types of CMOS devices, e.g., NMOS and/or PMOS logic devices, are concurrently being fabricated (concurrently fabricated NMOS and/or PMOS logic devices not shown in FIGS. 4A through 4E).

Although not explicitly represented in the present Figures, it is contemplated that fabrication of low mismatch MOSFET 200, in FIG. 2, may occur substantially concurrently with fabrication of both NMOS and PMOS devices, each including a dielectric cap in their respective gate stacks. In those embodiments, more than one iteration of steps 310 and 320 of flowchart 300 may occur. In other words, a first dielectric capping layer may be formed and removed, e.g., for concurrent conventional NMOS processing, followed by formation and removal of a second dielectric capping layer, e.g., for concurrent conventional PMOS processing, prior to subsequent step 330 in FIG. 3. The result of step 320 of flowchart 300 is illustrated by structure 420 in FIG. 4B.

Figure 4C:
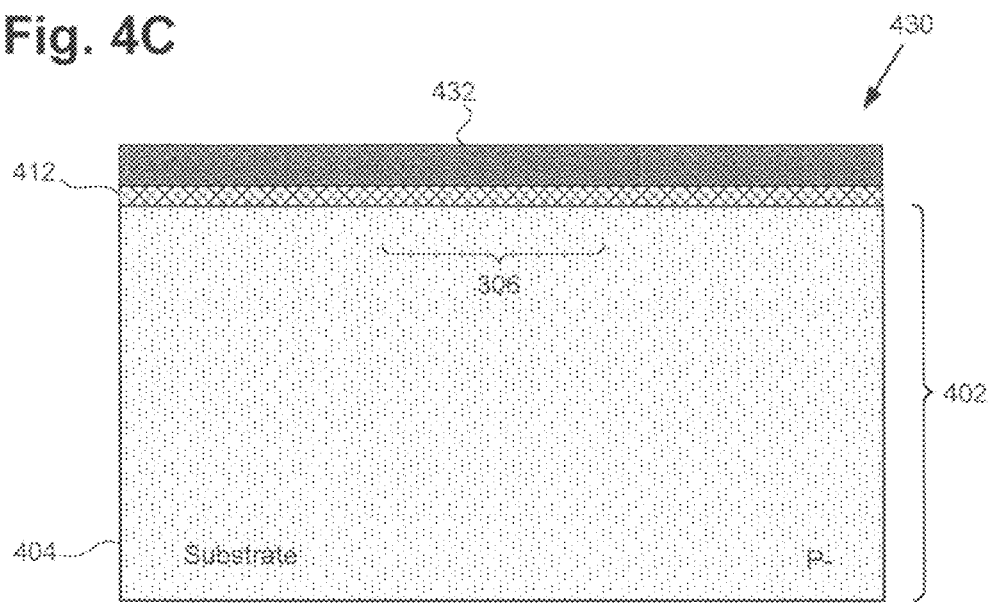
FIG. 4C shows a cross-sectional view, which includes a portion of a wafer fabricated according to an embodiment of the present invention, corresponding to an intermediate step in the flowchart in FIG. 3.

Referring to step 330 of flowchart 300 and referring to structure 430 in FIG. 4C, at step 330 of flowchart 300, gate metal layer 432 is formed on high-k dielectric layer 412, over lightly doped channel region 406. Gate metal layer 432 can comprise a gate metal used in a typical CMOS process flow, such as a gate metal for an NMOS or PMOS device gate. In embodiments of the invention in which a low mismatch semiconductor is fabricated using NMOS process steps, for example, gate metal layer 432 can comprise tantalum (Ta), tantalum nitride (TaN), titanium nitride (TiN), or other gate metal suitable for utilization in an NMOS device gate. Alternatively, in embodiments in which a low mismatch semiconductor device is being implemented as a low mismatch PMOS device, gate metal layer 432 can comprise molybdenum (Mo), ruthenium (Ru), tantalum carbide nitride (TaCN), or other metal suitable for utilization in a PMOS gate. Gate metal layer 432 can be formed, for example, by depositing a layer of tantalum, tantalum nitride, or titanium nitride on high-k dielectric layer 412 by utilizing a PVD process, a CVD process, or other deposition process. The result of step 330 of flowchart 300 is illustrated by structure 430 in FIG. 4C.

Figure 4D:
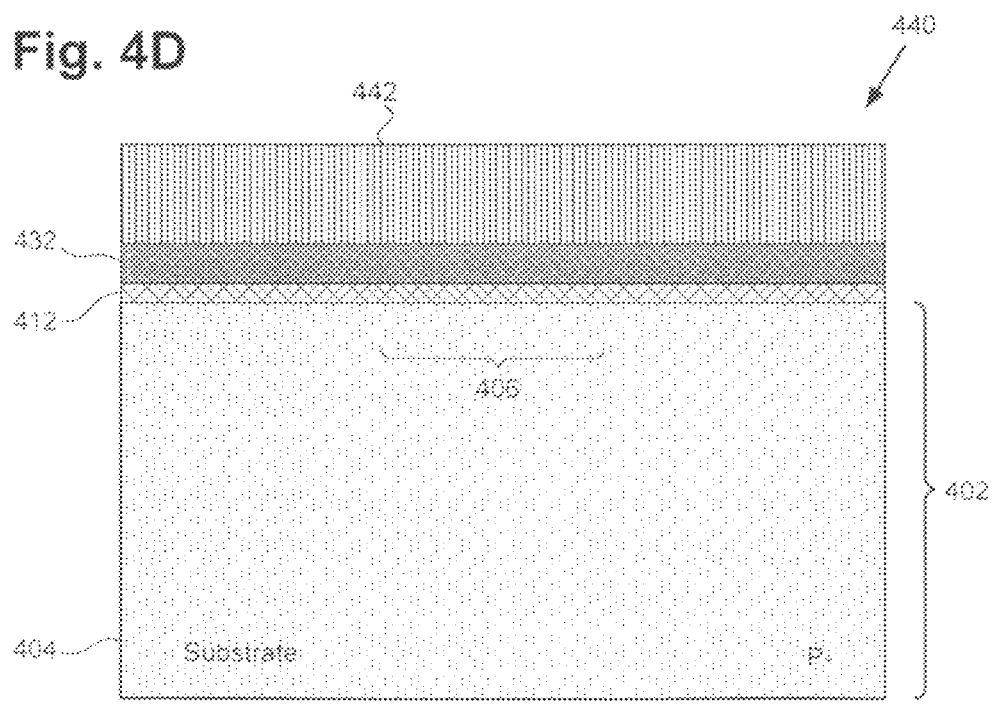
FIG. 4D shows a cross-sectional view, which includes a portion of a wafer fabricated according to an embodiment of the present invention, corresponding to an intermediate step in the flowchart in FIG. 3.

Continuing with step 340 of flowchart 300 and referring to structure 440 in FIG. 4D, at step 340 of flowchart 300, polysilicon layer 442 is formed over gate metal layer 432. Polysilicon layer 442 can be formed, for example, by depositing a layer of polysilicon over gate metal layer 422 utilizing a low pressure chemical vapor deposition (LPCVD) process or other suitable deposition process. The result of step 340 of flowchart 300 is illustrated by structure 440 in FIG. 4D.

Figure 4E:
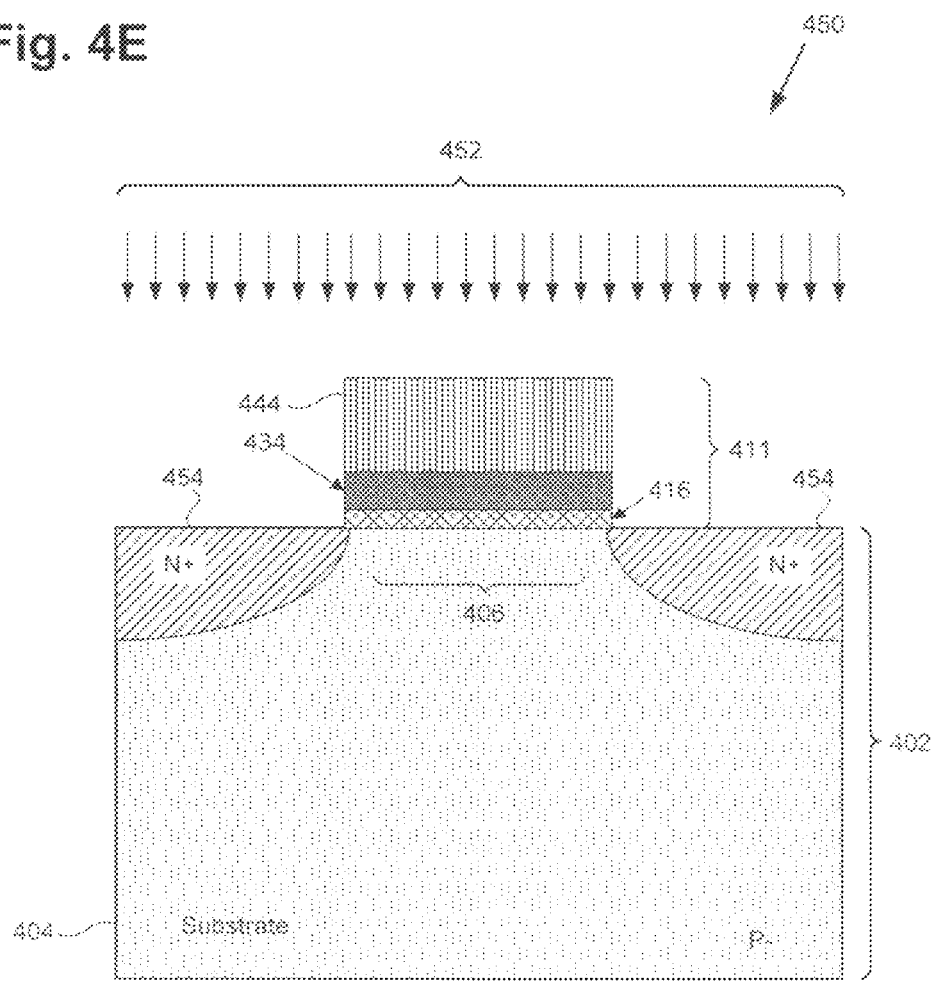
FIG. 4E shows a cross-sectional view, which includes a portion of a wafer fabricated according to an embodiment of the present invention, corresponding to a final step in the flowchart in FIG. 3.

Moving now to step 350 of FIG. 3 and referring to structure 450 in FIG. 4E, step 350 of flowchart 200 comprises patterning polysilicon layer 442, gate metal layer 432, and high-k dielectric layer 412, in FIG. 4D, to produce gate stack 411 including high-k gate dielectric 416, gate metal 434, and polysilicon 444, followed by implantation 452 of source/drain regions 454. In so far as typical CMOS fabrication steps include patterning of gate stacks including the materials used in gate stack 411, and further include implantation 452, formation of gate stack 411 and source/drain regions 454 may be accomplished using known CMOS process flows. The result of step 350 of flowchart 300 is illustrated by structure 450 in FIG. 4E.

The structures and methods disclosed in the present application enable several advantages over the conventional art. For example, by omitting a conventional channel implant, embodiments of the present invention eliminate a significant cause of device mismatch. In addition, by modifying the conventional CMOS high-k metal gate stack through elimination of a high-k dielectric cap, embodiments of the present invention enable omission of the channel implant without significant impact on the threshold voltage of the device. Moreover, because the present approach emphasizes reliance on the precisely controllable features of the gate stack for control of threshold voltage, while assuring that channel characteristics are substantially identical for devices fabricated on a common semiconductor wafer or die, embodiments of the present invention enable a substantial reduction in the incidence of device mismatch. Furthermore, the advantages associated with the present approach can be realized using existing high-k metal gate CMOS process flows, making integration of low mismatch high performance analog devices and CMOS logic devices on a common IC both efficient and cost effective. As a result, the present approach improves design flexibility without adding cost or complexity to established semiconductor device fabrication processes.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A low mismatch semiconductor device comprising:
   a lightly doped channel region having a first conductivity type and a first dopant concentration in a semiconductor body, said semiconductor body comprising a semiconductor substrate having an intrinsic dopant concentration substantially identical to said first dopant concentration; and
   a high-k metal gate stack including a gate metal layer formed over a high-k gate dielectric without having a dielectric cap on said high-k dielectric, said high-k metal gate stack being formed over said lightly doped channel region;
   wherein a threshold voltage of said low mismatch semiconductor device remains substantially unchanged.

2. The low mismatch semiconductor device of claim 1, wherein said semiconductor substrate having said first conductivity type, and wherein said lightly doped channel region is part of said semiconductor substrate.

3. The low mismatch semiconductor device of claim 1, wherein said semiconductor body has a second conductivity type opposite said first conductivity type, said semiconductor device further comprising:
   a lightly doped well having said first conductivity type and said first dopant concentration formed in said semiconductor body, wherein said lightly doped channel region is part of said lightly doped well.

4. The low mismatch semiconductor device of claim 1, wherein said first conductivity type is P type.

5. The low mismatch semiconductor device of claim 1, wherein said low mismatch semiconductor device comprises an analog MOSFET.

6. The low mismatch semiconductor device of claim 1, wherein said low mismatch semiconductor device comprises an NMOS device.

7. The low mismatch semiconductor device of claim 1, wherein said low mismatch semiconductor device is fabricated as part of an integrated circuit (IC) including at least one CMOS logic device.

8. An integrated circuit (IC) including a plurality of semiconductor devices, at least one of said plurality of semiconductor devices characterized as a low mismatch semiconductor device comprising:
   a lightly doped channel region having a first conductivity type and a first dopant concentration in a semiconductor body, said semiconductor body comprising a semiconductor substrate having an intrinsic dopant concentration substantially identical to said first dopant concentration; and
   a high-k metal gate stack including a gate metal layer formed over a high-k gate dielectric without having a dielectric cap on said high-k dielectric, said high-k metal gate stack being formed over said lightly doped channel region;
   wherein a threshold voltage of said low mismatch semiconductor device remains substantially unchanged.

9. The IC of claim 8, wherein said at least one of said plurality of semiconductor devices comprises a low mismatch analog MOSFET.

10. The IC of claim 8, wherein said plurality of semiconductor devices further comprises at least one CMOS logic device.

11. The IC of claim 10, wherein said at least one CMOS logic device comprises:
    a well region in said semiconductor body and a doped channel implant formed in said well region, said well region and said doped channel implant having said first conductivity type; and
    a CMOS logic high-k metal gate stack formed over said doped channel implant, said CMOS logic high-k metal gate stack including a gate metal layer formed over a high-k gate dielectric and a dielectric cap situated between said high-k gate dielectric and said gate metal layer of said CMOS logic high-k metal gate stack.

12. The IC of claim 11, wherein said at least one of said plurality of semiconductor devices and said at least one CMOS logic device comprise NMOS devices, and wherein a work function of said high-k metal gate stack is approximately 200 mV to 300 mV greater than a work function of said CMOS logic high-k metal gate stack.

13. The IC of claim 11, wherein said at least one of said plurality of semiconductor devices and said at least one CMOS logic device comprise PMOS devices, and wherein a work function of said high-k metal gate stack is approximately 200 mV to 300 mV less than a work function of said CMOS logic high-k metal gate stack.

14. A method for fabricating a low mismatch semiconductor device, said method comprising:
    forming a high-k gate dielectric over a lightly doped channel region in a semiconductor body, said lightly doped channel region having a first conductivity type and a first dopant concentration, said semiconductor body comprising a semiconductor substrate having an intrinsic dopant concentration substantially identical to said first dopant concentration; and forming a gate metal layer over said high-k gate dielectric without having a dielectric cap on said high-k dielectric;

wherein a threshold voltage of said low mismatch semiconductor device remains substantially unchanged.

15. The method of claim 14, wherein said semiconductor substrate having said first conductivity type, and wherein said lightly doped channel region is part of said semiconductor substrate.

16. The method of claim 14, wherein said semiconductor body has a second conductivity type opposite said first conductivity type, said semiconductor device further comprising:

a lightly doped well having said first conductivity type and said first dopant concentration formed in said semiconductor body, wherein said lightly doped channel region is part of said lightly doped well.

17. The method of claim 14, wherein said first conductivity type is P type.

18. The method of claim 14, further comprising:

forming a dielectric capping layer over said high-k gate dielectric; and removing said dielectric capping layer before forming said gate metal layer on said high-k gate dielectric.

19. The method of claim 14, wherein fabricating said low mismatch semiconductor device comprises fabricating an analog MOSFET.

20. The method of claim 14, wherein fabricating said low mismatch semiconductor device is performed substantially concurrently with fabrication of at least one CMOS logic device.

* * * * *